(12) United States Patent
Maeda et al.

(10) Patent No.: US 7,439,005 B2
(45) Date of Patent: Oct. 21, 2008

(54) STYRENE DERIVATIVE, STYRENE POLYMER, PHOTOSENSITIVE RESIN COMPOSITION, AND METHOD FOR FORMING PATTERN

(75) Inventors: Katsumi Maeda, Tokyo (JP); Kaichiro Nakano, Tokyo (JP)

(73) Assignee: NEC Corporation, Tokyo (JP)

( * ) Notice: Subject to any disclaimer, the term of this patent is extended or adjusted under 35 U.S.C. 154(b) by 221 days.

(21) Appl. No.: 10/590,804

(22) PCT Filed: Feb. 25, 2005

(86) PCT No.: PCT/JP2005/003153

§ 371 (c)(1),
(2), (4) Date: Aug. 25, 2006

(87) PCT Pub. No.: WO2005/082956

PCT Pub. Date: Sep. 9, 2005

(65) Prior Publication Data

US 2007/0134586 A1    Jun. 14, 2007

(30) Foreign Application Priority Data

Feb. 26, 2004 (JP) ............... 2004-051542
Dec. 7, 2004 (JP) ............... 2004-353485

(51) Int. Cl.
*G03F 7/023* (2006.01)
*G03F 7/30* (2006.01)
*G03F 7/004* (2006.01)

(52) U.S. Cl. .............. 430/192; 430/193; 430/270.1; 430/325; 430/326; 430/330

(58) Field of Classification Search .......... 430/192, 430/193, 270.1, 325, 326, 330, 905
See application file for complete search history.

(56) References Cited

FOREIGN PATENT DOCUMENTS

| JP | 56-27140 | 3/1981 |
|---|---|---|
| JP | 57-170929 | 10/1982 |
| JP | 59-174604 | 10/1984 |
| JP | 61-005249 | 1/1986 |
| JP | 62-276548 | 12/1987 |
| JP | 01-46862 B | 11/1989 |
| JP | 05-019473 | 1/1993 |
| JP | 2001-356483 | 12/2001 |
| JP | 2002-296784 | 10/2002 |
| JP | 2003-114526 | 4/2003 |
| JP | 2004-006273 | 1/2004 |

OTHER PUBLICATIONS

M. Ueda, et al. Journal of Photopolymer Science and Technology, vol. 16(2), pp. 237 to 242 (2003).
K. Ebara, et al. Journal of Photopolymer Science and Technology, vol. 16(2), pp. 287 to 292 (2003).

*Primary Examiner*—John S Chu
(74) *Attorney, Agent, or Firm*—Young & Thompson

(57) ABSTRACT

There is disclosed a photosensitive resin composition for interlayer insulating films, surface protection films or the like, which exhibits excellent resolution and can be developed with an aqueous alkaline solution. The photosensitive resin composition is prepared using a polymer at least having a constitutional repeating unit represented by general formula II:

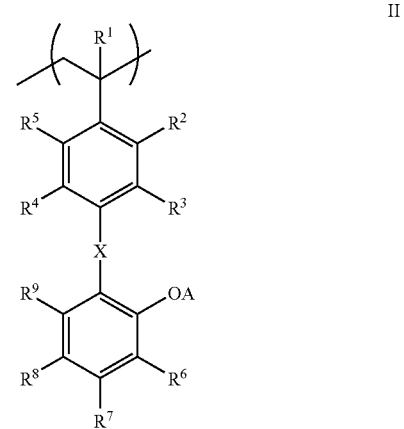

wherein $R^1$ represents hydrogen atom or methyl group; $R^2$ to $R^9$ independently represent hydrogen atom, halogen atom or alkyl group having 1 to 4 carbon atoms; X represents —CH=N—, —CONH—, —(CH$_2$)$_n$—CH=N— or —(CH$_2$)$_n$—CONH— and the N atom in X is bonded to a carbon atom in the benzene ring having AO— at an o-position; A represents hydrogen atom or a group being decomposed by an acid; and n represents a positive integer of 1 to 3.

14 Claims, No Drawings

STYRENE DERIVATIVE, STYRENE POLYMER, PHOTOSENSITIVE RESIN COMPOSITION, AND METHOD FOR FORMING PATTERN

TECHNICAL FIELD

The present invention relates to a novel styrene derivative, a styrene polymer, a photosensitive resin composition and a patterning method. In particular, it relates to a styrene derivative, a styrene polymer, a photosensitive resin composition and a patterning method, which can be applied to an interlayer insulating film, a surface protection film or the like in a semiconductor device.

BACKGROUND ART

Polyimides resins having excellent film properties such as heat resistance, mechanical properties and electric properties have been conventionally used for an interlayer insulating film or surface protection film in a semiconductor device. However, when using a non-photosensitive polyimide resin as an interlayer insulating film or the like, a patterning process requires the use of a positive resist, which leads to additional processes such as etching and resist removal, resulting in a more complex manufacturing process. There has been, therefore, investigated the use of a photosensitive polyimide resin exhibiting good photo-sensitivity. It can be used as an interlayer insulating film or the like to eliminate the use of a positive resist in the patterning process, resulting in a simple manufacturing process. Examples of such a photosensitive polyimide resin composition include positive photosensitive resin compositions consisting of a polyamic acid, an aromatic bisazide compound and an amine compound described in Patent document 1. However, a developing step in a patterning process of a photosensitive polyimide resin requires an organic solvent such as N-methyl-2-pyrrolidone and ethanol, which may lead to problems related to safety or environmental impact.

Thus, there has been recently developed a positive photosensitive resin composition as a patterning material which can be developed with an aqueous alkaline solution such as an aqueous solution of tetramethylammonium hydroxide (TMAH) used in a fine patterning process for a semiconductor. For example, Patent Document 2 has described a non-chemical amplification type of positive photosensitive resin composition consisting of a polybenzoxazole precursor and a diazoquinone compound as a photosensitizing agent. Non-Patent Document 1 has described a non-chemical amplification type of positive photosensitive resin composition consisting of a polybenzoxazole precursor and a 1,2-naphthoquinonediazide-5-sulfonate. In addition, Non-Patent Document 2 has described a chemical amplification type of positive photosensitive resin composition consisting of a polybenzoxazole precursor protected by a group being decomposed by an acid and a photoacid generator.

In such a photosensitive resin composition, its structure is changed by heating to form a benzoxazole ring, resulting in good heat resistance and electric properties. For example, a polybenzoxazole precursor described in Non-Patent Document 1 forms a benzoxazole ring by heating after development with an alkaline solution as shown in reaction equations A and A'. Since the benzoxazole ring is a stable structure, an interlayer insulating film or surface protection film prepared using a photosensitive composition consisting of the poly-benzoxazole precursor exhibits excellent film properties such as heat resistance, mechanical properties and electric properties.

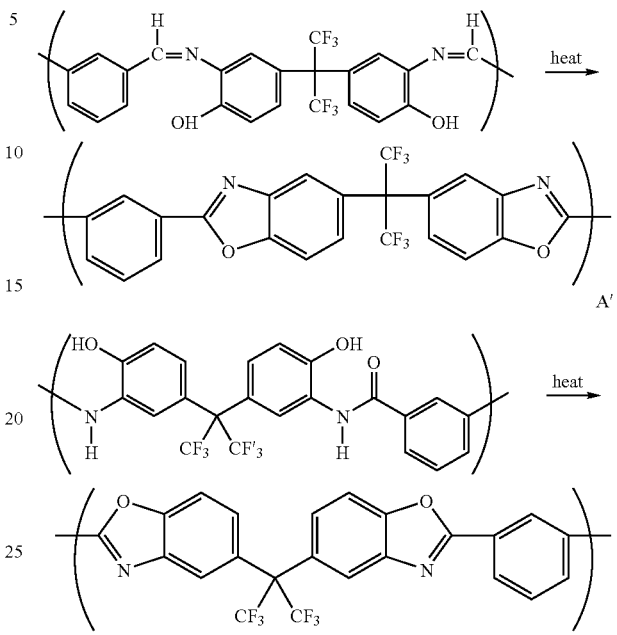

Patent Document 1: Japanese published examined application 3-36861.
Patent Document 2: Japanese published examined application 1-46862.
Non-Patent Document 1: M. Ueda et al., Journal of Photopolymer Science and Technology, Vol.16(2), pp. 237 to 242 (2003).
Non-Patent Document 2: K. Ebara et al., Journal of Photopolymer Science and Technology, Vol 16(2), pp. 287 to 292 (2003).

DISCLOSURE OF INVENTION (Problems to be Solved by the Invention)

In the field of manufacturing a semiconductor device, there has been further needed a higher density, higher integration and a finer interconnection pattern in the device. Consequently, requirements have been stricter to a photosensitive resin composition used for an interlayer insulating film, surface protection film or the like; specifically, in addition to higher resolution, the use of a negative type depending on a pattern or a purpose. In the light of these requirements, any photosensitive resin composition described in the above references is not satisfactory.

There is, therefore, needed to develop a positive and a negative photosensitive resin compositions which can be developed with an alkaline solution and exhibit higher resolution while maintaining good heat resistance, mechanical properties and electric properties.

Thus, a first objective of the present invention for solving the above problems is to provide a styrene derivative and styrene polymer which can be preferably used as a raw material for a photosensitive resin composition. A second objective is to provide not only a positive but also a negative photosensitive resin compositions exhibiting excellent film properties such as heat resistance, mechanical properties and electric properties, which can be developed with an alkaline solution. A third objective is to provide a patterning method using a photosensitive resin composition.

(Means for Solving the Problems)

After intense investigation for achieving the above objectives, we have found that a styrene polymer prepared by polymerizing a novel styrene derivative having a particular structure is an excellent photosensitive resin composition which can be developed with an aqueous alkaline solution with higher resolution, and have thus achieved this invention.

A styrene derivative of the present invention which can achieve the, first objective is represented by general formula I:

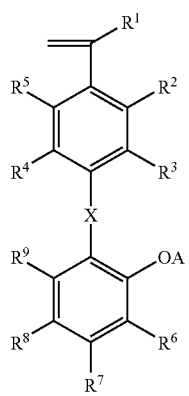

I wherein $R^1$ represents hydrogen atom or methyl group; $R^2$ to $R^9$ independently represent hydrogen atom, halogen atom or alkyl group having 1 to 4 carbon atoms; X represents —CH=N—, —CONH—, —(CH$_2$)$_n$—CH=N— or —(CH$_2$)$_n$—CONH—, and the N atom in X is bonded to a carbon atom in the benzene ring having AO— at an o-position; A represents hydrogen atom or a group being decomposed by an acid; and n represents an integer of 1 to 3.

Since the styrene derivative of the present invention has the structure represented by general formula I, it can be preferably used as a raw material for polymerization to give a styrene polymer having the structure as a repeating unit.

A styrene polymer of the present invention for achieving the first objective comprises one or more repeating constitutional units represented by general formula II:

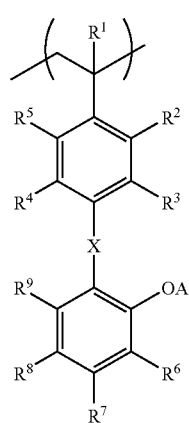

II wherein $R^1$ represents hydrogen atom or methyl group; $R^2$ to $R^9$ independently represents hydrogen atom, halogen atom or alkyl group having 1 to 4 carbon atoms; X represents —CH=N—, —CONH—, —(CH$_2$)$_n$—CH=N— or —(CH$_2$)$_n$—CONH—, and the N atom in X is bonded to a carbon atom in the benzene ring having AO— at an o-position; A represents hydrogen atom or a group being decomposed by an acid; and n represents an integer of 1 to 3.

Since the styrene polymer of the present invention has a repeating constitutional unit represented by general formula II, it gives after heating a stable benzoxazole ring structure. Furthermore, since the styrene polymer of the present invention has a repeating unit having a phenolic hydroxide, a photosensitive resin composition using the styrene polymer of the present invention can be developed with an alkaline developer.

The styrene polymer of the present invention is prepared by polymerizing the styrene derivative of the present invention represented by general formula I with a vinyl monomer copolymerizable with the styrene derivative.

Although the styrene polymer of the present invention can be prepared by polymerizing the above styrene derivative, it may be also prepared by, besides homopolymerization of the styrene derivative, copolymerization of the styrene derivative with a vinyl monomer. According to this invention, copolymerization of the styrene derivative with a vinyl monomer copolymerizable with the styrene derivative imparts vinyl monomer properties to the polymer, resulting in improvement useful properties (for example, heat resistance, mechanical properties and electric properties) for an interlayer insulating film or surface protection film formed from a photosensitive resin composition containing the styrene polymer of the present invention.

The styrene polymer of the present invention preferably has a weight average molecular weight of 2,000 to 200,000.

A photosensitive resin composition of the present invention for achieving the second objective comprises the above styrene polymer of the present invention.

According to this invention, the composition contains the above styrene polymer of the present invention, so that it can be developed with an alkaline developer, giving a pattern with a higher resolution. An interlayer insulating film or surface protection film prepared from this photosensitive resin composition can exhibit excellent film properties such as heat resistance, mechanical properties and electric properties because a benzoxazole ring is formed by heating.

A positive photosensitive resin composition of the present invention comprises at least the styrene polymer of the present invention and a diazonaphthoquinonesulfonate derivative. According to this invention, the diazonaphthoquinonesulfonate derivative acts as a photosensitizing agent, so that when a film is formed from a photosensitive resin composition of the present invention and the film is selectively exposed and then developed, an exposed area has a higher solubility in an alkaline developer. Consequently, a solubility difference (hereinafter, also referred to as "solubility contrast") between an exposed and an unexposed areas in an alkaline developer is increased, resulting in a pattern with excellent resolution.

A positive photosensitive resin composition of the present invention comprises at least the styrene polymer of the present invention and a photoacid generator which generates an acid by light irradiation.

According to this invention, the photosensitive resin composition of the present invention which contains a styrene polymer and a photoacid generator is used to form a film, which is then selectively exposed to generate an acid from an exposed area. The generated acid decomposes a group being decomposed by an acid in the styrene polymer, so that on development, solubility to an alkaline developer is increased in an exposed area. Consequently, a solubility contrast between an exposed and an unexposed areas is increased, forming a pattern with excellent resolution. Thus, since the acid generated from the photoacid generator increases a solubility contrast, the positive photosensitive resin composition is of a so-called chemical amplification type.

A negative photosensitive resin composition of the present invention comprises at least a styrene polymer having the repeating constitutional unit represented by general formula II and a photoacid generator. In the photosensitive resin composition, the above styrene polymer has a repeating constitutional unit having a functional group which can be cross-linked by an acid.

The photosensitive resin composition of this invention has a functional group which can be cross-linked by a photoacid generator and an acid, so that when a film is formed from the photosensitive resin composition and then selectively exposed, the photoacid generator in an exposed area generates an acid, which initiates a cross-linking reaction. Thus, after development, the exposed area becomes insoluble to an alkaline developer, resulting in increase in a solubility contrast between an exposed and an unexposed areas. As a result, a pattern obtained exhibits higher resolution. Since the acid generated from the photoacid generator leads to a larger solubility contrast as described above, this negative photosensitive resin composition is of a so-called chemical amplification type.

Alternatively, the negative photosensitive resin composition of the present invention further comprises a polyfunctional epoxy compound as a compound promoting an acid-initiated cross-linking reaction. The negative photosensitive resin composition of the present invention may further comprise a phenol derivative or a polynuclear phenol derivative and may comprise a polyol, as the compound promoting an acid-initiated cross-linking reaction.

A patterning method of the present invention for achieving the third objective comprises at least: an application step applying the photosensitive resin composition of the present invention on a processed substrate; a pre-bake step fixing the photosensitive resin composition on the processed substrate; an exposure step selectively exposing the photosensitive resin composition; a development step dissolving and removing the exposed or the unexposed area in the photosensitive resin composition to form a pattern; and a post-bake step curing the patterned photosensitive resin composition.

When using the above chemical amplification type of positive photosensitive resin composition in the patterning method of the present invention, it is desirable that between the exposure step and the development step, a post-exposure-bake step in which a generated acid after the exposure is diffused is conducted, and the exposed area is dissolved and removed in the development step.

Furthermore, when using the above chemical amplification type of negative photosensitive resin composition in the patterning method of the present invention, it is desirable that between the exposure step and the development step, a post-exposure-bake step in which a generated acid after the exposure is diffused is conducted, and the unexposed area is dissolved and removed in the development step.

According to these inventions, the post-exposure-bake step between the exposure step and the development step allows an acid generated from a photoacid generator to be more effective in a chemical amplification type of positive or negative photosensitive resin composition. As a result, a pattern with a higher resolution can be obtained with a lower light exposure.

(Effects of the Invention)

A styrene derivative of the present invention can be preferably used as a raw material for polymerizing a styrene polymer. A styrene polymer of the present invention can be preferably used as a material for obtaining a non-chemical and a chemical amplification type of positive photosensitive resin compositions as wells as a chemical amplification type of negative photosensitive resin composition. Furthermore, a photosensitive resin composition and a patterning method according to the present invention allows development with an alkaline developer, forming a pattern with a higher resolution which exhibits excellent film properties such as heat resistance, mechanical properties and electric properties.

BEST MODE FOR CARRYING OUT THE INVENTION

There will be sequentially described a styrene derivative, a styrene polymer, a photosensitive resin composition and a patterning method in accordance with the present invention.

<Styrene Derivative>

A styrene derivative of the present invention is represented by general formula I. In formula I, $R^1$ represents hydrogen atom or methyl group; $R^2$ to $R^9$ independently represent hydrogen atom, halogen atom or alkyl group having 1 to 4 carbon atoms; X is —CH=N—, —CONH—, —$(CH_2)_n$—CH=N— or —$(CH_2)_n$—CONH—, and the N atom in X is bonded to a carbon atom in the benzene ring having AO— at an o-position; A represents hydrogen atom or a group being decomposed by an acid (hereinafter, referred to as "an acid decomposable group"); and n represents a positive integer of 1 to 3.

Examples of halogen atom include fluorine atom and chlorine atom. Examples of alkyl group having 1 to 4 carbon atoms include methyl group, ethyl group, n-propyl group, isopropyl group, n-butyl group and tert-butyl group. Examples of an acid decomposable group include t-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, methoxymethyl group and ethoxymethyl group.

Specific examples of the styrene derivative represented by general formula I include, but not limited to, the following compounds: A-1, A-3, A-5, A-7, A-9, A-11, A-17, A-18, A-19, A-20, A-21, A-22 and A-23 as a compound in which X is —CONH—; A-2, A-4, A-6, A-8, A-10 and A-12 as a compound in which X is —CH=N—; A-13 and A-15 as a compound in which X is —$(CH_2)_n$—CONH—; A-14 and A-16 as a compound in which X is —$(CH_2)_n$—CH=N—.

A-1

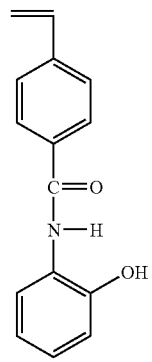

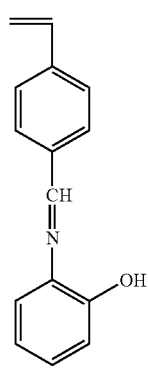
A-2
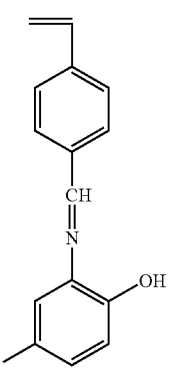
A-6
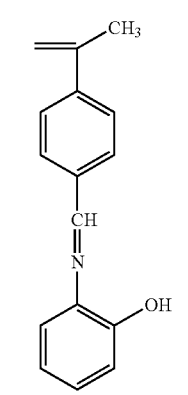
A-3
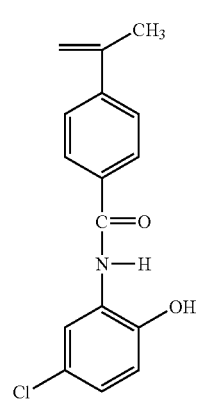
A-7
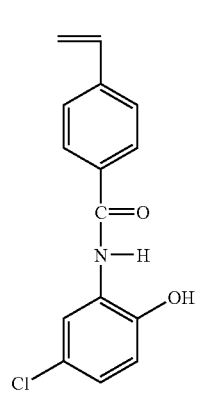
A-4
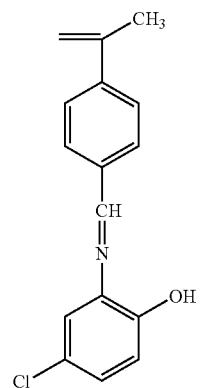
A-8
A-5
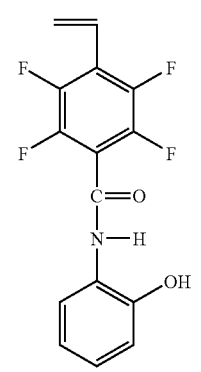
A-9

A-10
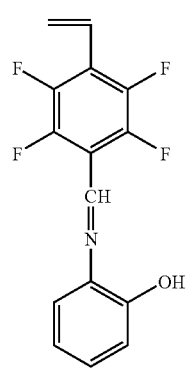
A-11
A-12
A-13
A-14
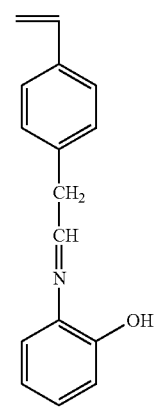
A-15
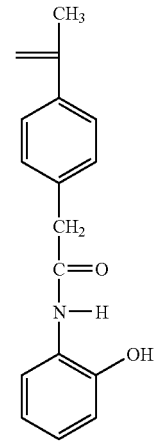
A-16
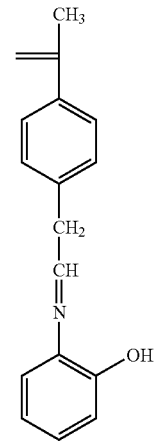
A-17
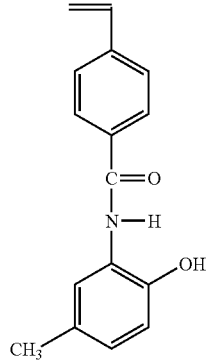

-continued

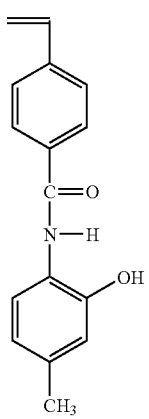
A-18

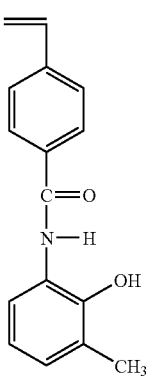
A-19

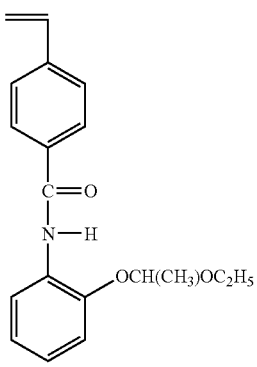
A-20

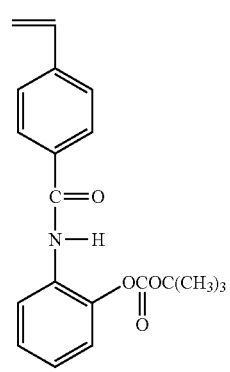
A-21

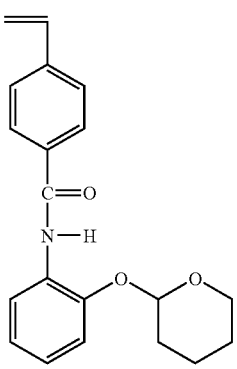
A-22

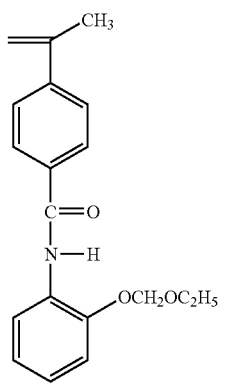
A-23

The specific names of the above compounds are as follows:
A-1: N-(2-hydroxyphenyl)-4-vinylbenzamide;
A-2: 2-hydroxy-N-(4-vinylbenylidene)aniline;
A-3: N-(2-hydroxyphenyl)-4-isopropenylbenzamide;
A-4: 2-hydroxy-N-(4-isopropylbenylidene)aniline;
A-5: N-(5-chloro-2-hydroxyphenyl)-4-vinylbenzamide;
A-6: 5-chloro-2-hydroxy-N-(4-vinylbenylidene)aniline;
A-7: N-(5-chloro-2-hydroxyphenyl)-4-isopropenylbenzamide;
A-8: 5-chloro-2-hydroxy-N-(4-isopropylbenylidene)aniline;
A-9: N-(2-hydroxyphenyl)-2,3,5,6-tetrafluoro-4-vinylbenzamide;
A-10: 2-hydroxy-N-(2,3,5,6-tetrafluoro-4-vinylbenylidene)aniline;
A-11: N-(2-hydroxyphenyl)-2,3,5,6-tetrafluoro-4-isopropenylbenzamide;
A-12: 2-hydroxy-N-(2,3,5,6-tetrafluoro-4-isopropylbenylidene)aniline;
A-13: N-(2-hydroxyphenyl)-4-vinylbenzylamide;
A-14: 2-hydroxy-N-(4-vinylphenethylidene)aniline;
A-15: N-(2-hydroxyphenyl)-4-isopropenylbenzylamide;
A-16: 2-hydroxy-N-(4-isopropylphenethylidene)aniline;
A-17: N-(2-hydroxy-5-methylphenyl)-4-vinylbenzamide;
A-18: N-(2-hydroxy-4-methylphenyl)-4-vinylbenzamide;
A-19: N-(2-hydroxy-3-methylphenyl)-4-vinylbenzamide;
A-20: N-(2-ethoxyethoxyphenyl)-4-vinylbenzamide;
A-21: N-(2-t-butoxycarbonyloxyphenyl)-4-vinylbenzamide;
A-22: N-(2-tetrahydropyranyloxyphenyl)-4-vinylbenzamide; and
A-23: N-(2-ethoxymethoxyphenyl)-4-isopropenylbenzamide.

A styrene polymer containing any of these styrene derivatives as a repeating unit forms a stable benzoxazole ring by heating, and thus has excellent film properties such as heat resistance, mechanical properties and electric properties.

Among the styrene derivatives represented by general formula I, those in which $R^1$ to $R^9$ are hydrogen atom; X is —CONH—; and A is hydrogen atom may be, for example, synthesized by the following procedure.

First, 4-vinylbenzoic acid and pentafluorophenol or 2-mercaptobenzoxazole are reacted in a mixture solvent of THF-ethyl acetate at room temperature in the presence of dicyclohexylcarbodiimide, to give an activated ester of 4-vinylbenzoate. Next, the activated ester of 4-vinylbenzoate is reacted with an aminophenol compound at 60 to 100° C., to provide a desired styrene derivative.

<Styrene Polymer>

A styrene polymer of the present invention contains one or more repeating constitutional units represented by general formula II. In formula II, $R^1$ represents hydrogen atom or methyl group; $R^2$ to $R^9$ independently represents hydrogen atom, halogen atom or alkyl group having 1 to 4 carbon atoms; X is —CH=N—, —CONH—, —(CH$_2$)$_n$—CH=N— or —(CH$_2$)$_n$—CONH—, and the N atom in X is bonded to a carbon atom in the benzene ring having AO— at an o-position; A represents hydrogen atom or an acid decomposable group; and n represents a positive integer of 1 to 3.

Examples of halogen atom include fluorine atom and chlorine atom. Examples of alkyl group having 1 to 4 carbon atoms include methyl group, ethyl group, n-propyl group, isopropyl group, n-butyl group and tert-butyl group. Examples of an acid decomposable group include t-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, methoxymethyl group and ethoxymethyl group.

Examples of the constitutional repeating unit represented by general formula II include, but not limited to, the followings: B-1, B-3, B-5, B-7, B-9, B-11, B-17, B-18, B-19, B-20, B-21, B-22 and B-23 as a compound in which X is —CONH—; B-2, B-4, B-6, B-8, B-10 and B-12 as a compound in which X is —CH=N—; B-13 and B-15 as a compound in which X is —(CH$_2$)$_n$—CONH—; B-14 and B-16 as a compound in which X is —(CH$_2$)$_n$—CH=N—.

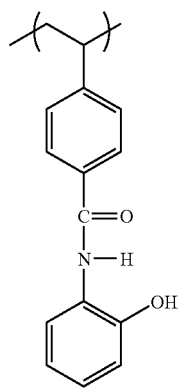

B-1

-continued

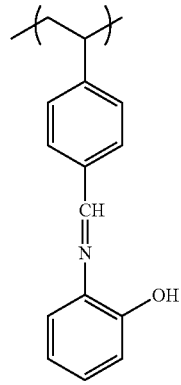

B-2

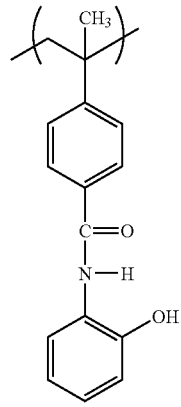

B-3

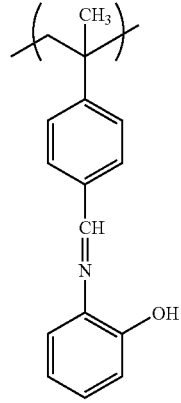

B-4

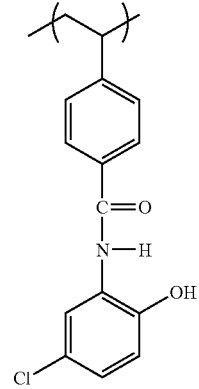

B-5

-continued
B-6
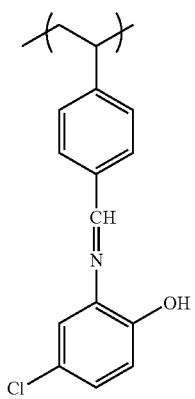
B-7
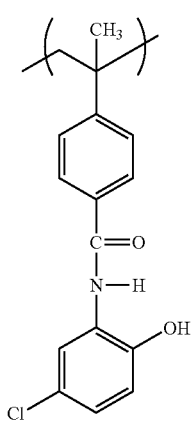
B-8
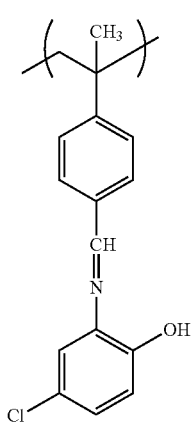
B-9
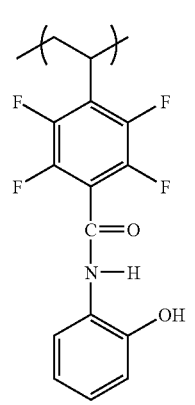
-continued
B-10
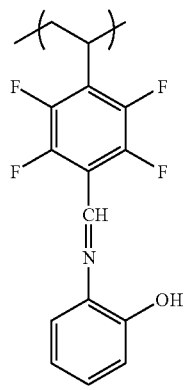
B-11
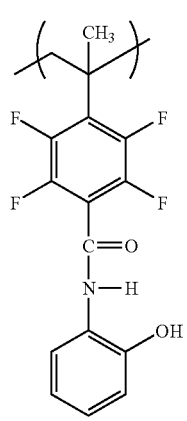
B-12
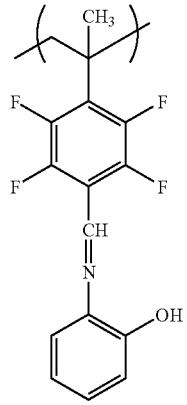
B-13
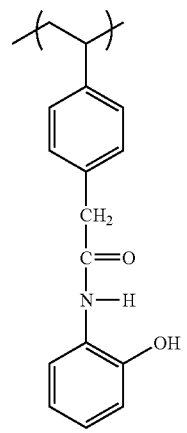

B-14
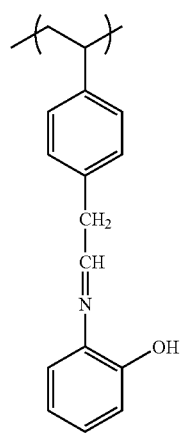
B-15
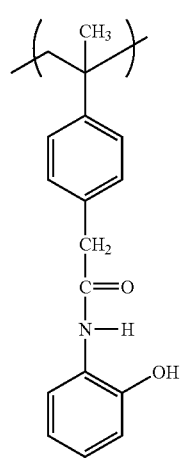
B-16
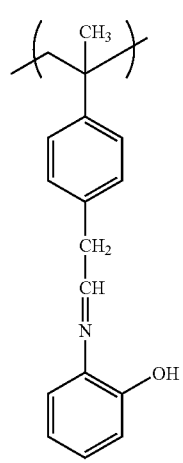
B-17
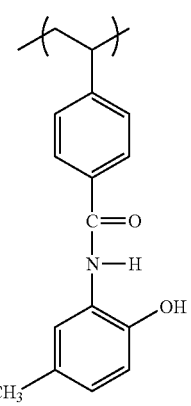
B-18
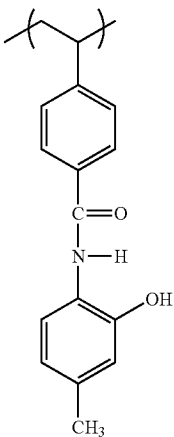
B-19
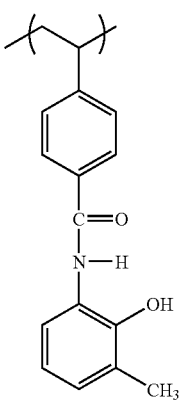

-continued

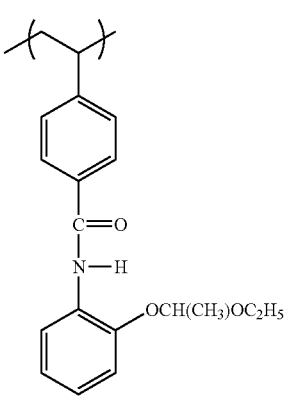
B-20

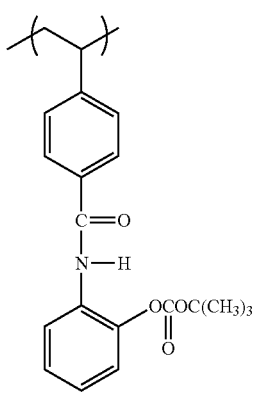
B-21

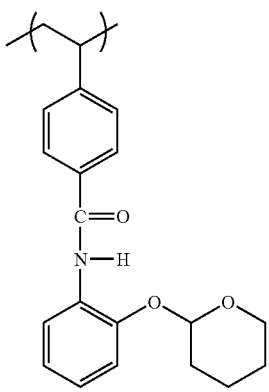
B-22

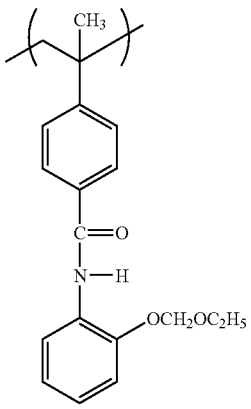
B-23

The specific names of the above compounds are as follows:
B-1: Poly[N-(2-hydroxyphenyl)-4-vinylbenzamide];
B-2: Poly[2-hydroxy-N-(4-vinylbenylidene)aniline];
B-3: Poly[N-(2-hydroxyphenyl)-4-isopropenylbenzamide];
B-4: Poly[2-hydroxy-N-(4-isopropylbenylidene)aniline];
B-5: Poly[N-(5-chloro-2-hydroxyphenyl)-4-vinylbenzamide]
B-6: Poly[5-chloro-2-hydroxy-N-(4-vinylbenylidene)aniline];
B-7: Poly[N-(5-chloro-2-hydroxyphenyl)-4-isopropenylbenzamide];
B-8: Poly[5-chloro-2-hydroxy-N-(4-isopropylbenylidene)aniline];
B-9: Poly[N-(2-hydroxyphenyl)-2,3,5,6-tetrafluoro-4-vinylbenzamide];
B-10: Poly[2-hydroxy-N-(2,3,5,6-tetrafluoro-4-vinylbenylidene)aniline];
B-11: Poly[N-(2-hydroxyphenyl)-2,3,5,6-tetrafluoro-4-isopropenylbenzamide];
B-12: Poly[2-hydroxy-N-(2,3,5,6-tetrafluoro-4-isopropylbenylidene)aniline];
B-13: Poly[N-(2-hydroxyphenyl)-4-vinylbenzylamide];
B-14: Poly[2-hydroxy-N-(4-vinylphenethylidene)aniline];
B-15: Poly[N-(2-hydroxyphenyl)-4-isopropenylbenzylamide];
B-16: Poly[2-hydroxy-N-(4-isopropylphenethylidene)aniline];
B-17: Poly[N-(2-hydroxy-5-methylphenyl)-4-vinylbenzamide];
B-18: Poly[N-(2-hydroxy-4-methylphenyl)-4-vinylbenzamide];
B-19: Poly[N-(2-hydroxy-3-methylphenyl)-4-vinylbenzamide];
B-20: Poly[N-(2-ethoxyethoxyphenyl)-4-vinylbenzamide];
B-21: Poly[N-(2-t-butoxycarbonyloxyphenyl)-4-vinylbenzamide];
B-22: Poly[N-(2-tetrahydropyranyloxyphenyl)-4-vinylbenzamide]; and
B-23: Poly[N-(2-ethoxymethoxyphenyl)-4-isopropenylbenzamide].

The styrene polymer of the present invention is, after patterning, heated to form a benzoxazole ring.

For example, a styrene polymer in which $R^1$ to $R^9$ are hydrogen atom; X is —CONH—; and A is hydrogen atom undergoes a ring-closing reaction by heating to form benzoxazole ring as shown in reaction equation B.

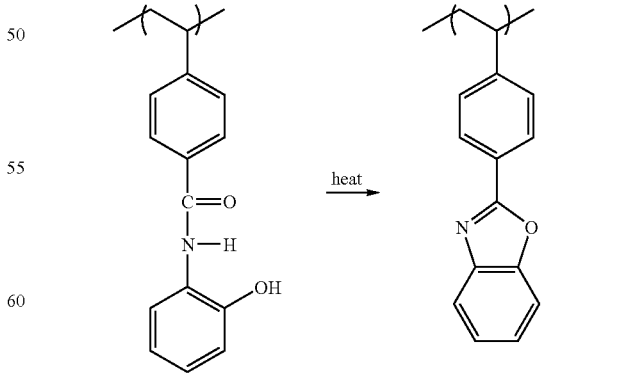
B

A styrene polymer in which A is an acid decomposable group; $R^1$ to $R^9$ are hydrogen atom; and X is —CONH— undergoes a ring-closing reaction by heating or by heating after decomposing the acid decomposable group with an acid to form a benzoxazole ring as shown in reaction equation C.

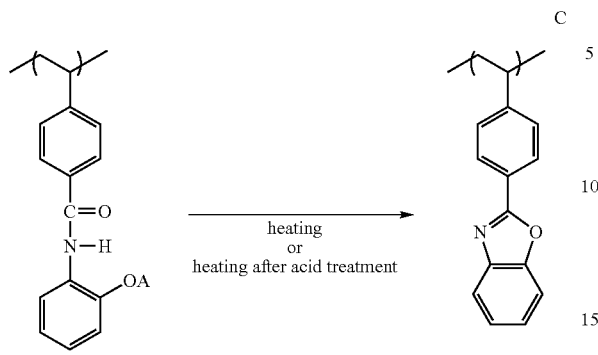

Since this benzoxazole ring is a stable structure, this styrene polymer can be used for an interlayer insulating film or surface protection film, to provide an interlayer insulating film or surface protection film having excellent film properties such as heat resistance, mechanical properties and electric properties.

A raw material for the styrene polymer of the present invention can be suitably selected from the styrene derivatives of the present invention represented by general formula I, but is not limited to them as long as a styrene polymer containing the repeating constitutional unit represented by general formula II can be prepared.

A styrene polymer of the present invention may be prepared by homopolymerization of the styrene derivative of the present invention represented by general formula I, or alternatively by copolymerization of the styrene derivative with a comonomer. A styrene polymer prepared by copolymerization of the above styrene derivative and a comonomer imparts comonomer properties to the polymer. Therefore, various comonomers can be used to improve properties (e. g., resolution and sensitivity) useful for a photosensitive resin composition containing the styrene polymer and properties (e. g., heat resistance, mechanical properties and electric properties) useful for an interlayer insulating film or surface protection film formed from a photosensitive resin.

A preferred comonomer is a vinyl monomer because it is sufficiently polymerizable with the styrene derivative. Examples of a vinyl monomer include butadiene, acrylonitrile, styrene, (meth)acrylic acid, ethylene derivatives, styrene derivatives other than those described above, (meth) acrylates, vinyl monomers having an acid decomposable group and vinyl monomers having a functional group being crosslinked by an acid (the functional group is hereinafter referred to as an "acid crosslinkable group"). Examples of an ethylene derivative include ethylene, propylene and vinyl chloride. Examples of a styrene derivative include α-methylstyrene, p-hydroxystyrene and chlorostyrene. In addition to a vinyl monomer, maleic anhydride and N-phenylmaleimide derivatives may be used. Examples of an N-phenylmaleimide derivative include N-phenylmaleimide and N-(4-methylphenyl)maleimide. One or more of these comonomers can be used.

Among these comonomers, styrene derivatives (e. g., α-methylstyrene and p-hydroxystyrene), butadiene and acrylonitrile can be suitably used for a styrene polymer used in a non-chemical amplification type of positive photosensitive resin composition.

Among these comonomers, styrene derivatives (e. g., styrene and p-hydroxystyrene) and monomers having an acid decomposable group can be suitably used as a comonomer for a styrene polymer used in a chemical amplification type of positive photosensitive resin composition. Examples of a monomer having an acid decomposable group include 4-vi-nylphenol derivatives represented by general formula III and (meth)acrylate derivatives having an acid decomposable group represented by general formula IV.

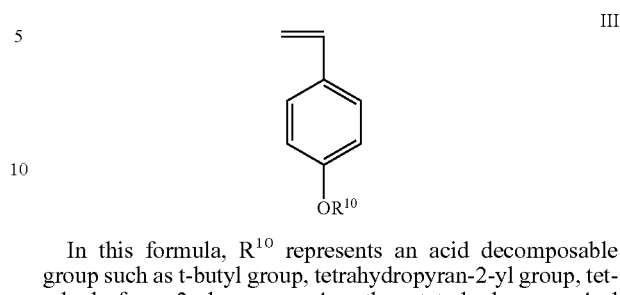

In this formula, $R^{10}$ represents an acid decomposable group such as t-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, methoxymethyl group and ethoxymethyl group.

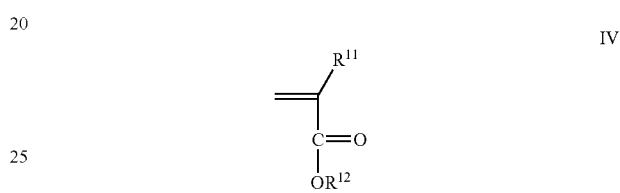

In this formula, $R^{11}$ represents hydrogen atom or methyl group; and $R^{12}$ represents an acid decomposable group. Examples of $R^{12}$ include t-butyl group, tetrahydropyran-2-yl group, tetrahydrofuran-2-yl group, 4-methoxytetrahydropyran-4-yl group, 1-ethoxyethyl group, 1-butoxyethyl group, 1-propoxyethyl group, methoxymethyl group and ethoxymethyl group.

Among these comonomers, styrene derivatives (e. g., styrene and p-hydroxystyrene) and monomers having an acid crosslinkable group are suitably used as a comonomer for a styrene polymer for a chemical amplification type of negative photosensitive resin composition. Specific examples are (meth)acrylate derivatives having an epoxy group represented by general formula V.

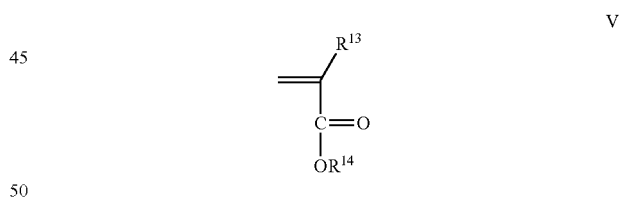

In this formula, $R^{13}$ represents hydrogen atom or methyl group; and $R^{14}$ is hydrocarbon group having an epoxy group. Examples of $R^{14}$ include glycidyl group, 3,4-epoxy-1-cyclohexylmethyl group, 5,6-epoxy-2-bicyclo[2,2,1]heptyl group, 5(6)-epoxyethyl-2-bicyclo[2,2,1]heptyl group, 5,6-epoxy-2-bicyclo[2,2,1]heptylmethyl group, 3,4-epoxytricyclo[5.2.1.0$^{2,6}$]decyl group, 3,4-epoxytricyclo[5.2.1.0$^{2,6}$]decyloxyethyl group, 3,4-epoxytetracyclo[4.4.0.1$^{2,5}$.1$^{7,10}$] dodecyl group and 3,4-epoxytetracyclo[4.4.0.1$^{2,5}$.1$^{7,10}$] dodecylmethyl group.

For achieving excellent film properties when using the styrene polymer for an interlayer insulating film or surface protection film, a content of the repeating constitutional unit represented by general formula II in a styrene polymer is preferably 10 to 100 mol %, more preferably 20 to 100 mol %.

A weight average molecular weight of the styrene polymer is preferably 2,000 to 200,000, more preferably 4,000 to 100,000. If a weight average molecular weight of the styrene polymer is less than 2,000, it may be difficult to form a uniform film when the styrene polymer is used for an interlayer insulating film or surface protection film. If a weight average molecular weight of the styrene polymer is more than 200,000, resolution may be deteriorated when the styrene polymer is used for an interlayer insulating film or surface protection film.

Such a styrene polymer can be prepared by polymerizing the above styrene derivative via a commonly used polymerization process such as radical polymerization and anion polymerization. For example, when a styrene polymer is prepared by radical polymerization, an appropriate radical polymerization initiator such as 2,2'-azobis(isobutyronitrile) is added to a dry tetrahydrofuran as a solvent, and the mixture can be stirred at 50 to 70° C. for 0.5 to 24 hours under an atmosphere of an inert gas such as argon and nitrogen, for conducting polymerization to give the styrene polymer.

<Photosensitive Resin Composition>

Next, there will be described a photosensitive resin composition of the present invention. Photosensitive resin compositions of the present invention containing the above styrene polymer and a photosensitizer can be generally classified into three categories: non-chemical amplification type of positive compositions, chemical amplification type of positive compositions and chemical amplification type of negative compositions. A photosensitizer may be a photosensitizing agent described later for a non-chemical amplification type of positive photosensitive resin composition or a photoacid generator described later for a chemical amplification type of positive photosensitive resin composition or chemical amplification type of negative photosensitive resin composition.

<Non-Chemical Amplification Type of Positive Photosensitive Resin Composition>

A non-chemical amplification type of positive photosensitive resin composition of the present invention contains at least the above styrene polymer of the present invention represented by general formula II and a photosensitizing agent as a photosensitizer, and can be generally prepared by mixing the styrene polymer with a photosensitizing agent described later. The styrene polymer may be selected from those having a constitutional unit in which A is hydrogen atom in general formula II.

When a film is formed from the positive photosensitive resin composition, patterned by exposure with chemical rays as described later and then developed, solubility in an alkaline developer is increased in an exposed area, resulting in increase of a solubility difference in an alkaline developer (hereinafter, also referred to as a "solubility contrast") between an exposed area and an unexposed area. Patterning using the positive photosensitive resin composition is conducted, utilizing such a solubility difference in an alkaline developer.

A photosensitizing agent may be any of those capable of providing a solubility contrast between an exposed and an unexposed areas after exposure of a positive photosensitive resin composition; for example, diazonaphthoquinonesulfonate derivatives and diazobenzoquinonesulfonate derivatives. Among others, diazonaphthoquinonesulfonate derivatives are preferably used in the light of improving a solubility contrast. Examples of a diazonaphthoquinonesulfonate derivative include esters of 1,2-naphthoquinonediazido-4-sulfonic acid with a phenolic compound and esters of 1,2-naphthoquinonediazido-5-sulfonic acid with a phenolic compound.

Examples of a photosensitizing agent include, but not limited to, those represented by the following formulas. These photosensitizing agents may be used alone or in mixture of two or more.

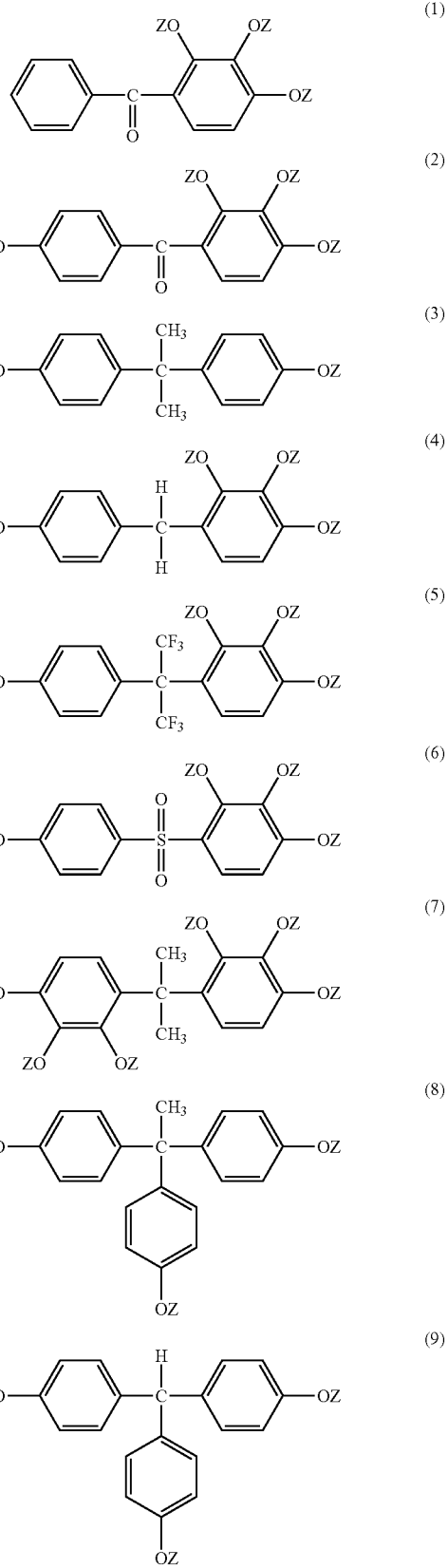

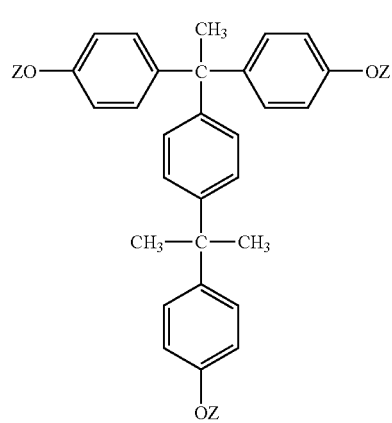

(10)

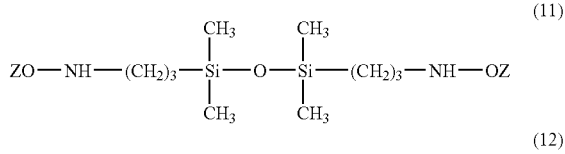

(11)

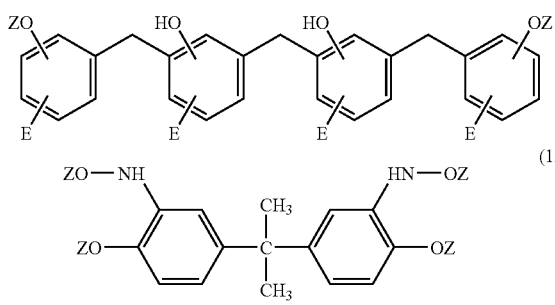

(12)

(13)

In any of formulas (1) to (13), Zs independently represent hydrogen atom or

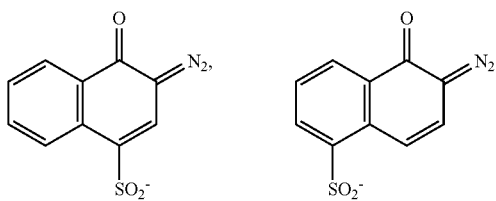

and at least one of Zs contained in the individual formulas is any of the followings:

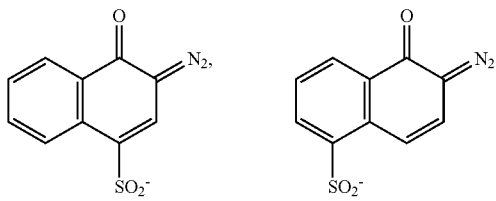

and Es in formula (12) independently represent hydrogen atom or methyl group.

A content of the photosensitizing agent is preferably 3 to 80 wt %, more preferably 10 to 40 wt % to the total of the styrene polymer and the photosensitizing agent in the light of achieving sensitivity giving an adequate solubility contrast between an exposed and an unexposed areas in a positive photosensitive composition and satisfactory patterning. If a content of the photosensitizing agent is less than 3 wt %, resolution in a pattern obtained may be reduced, while if it is more than 80 wt %, film properties such as heat resistance, mechanical properties and electric properties may be deteriorated.

<Chemical Amplification Type of Positive Photosensitive Resin Composition>

A chemical amplification type of positive photosensitive resin composition of the present invention contains a styrene polymer of the present invention and a photoacid generator as a photosensitizer. The styrene polymer of the present invention may be selected from styrene polymers having an acid decomposable group such as those having a constitutional unit in which A is an acid decomposable group in general formula II and those prepared by copolymerizing a styrene derivative of the present invention represented by general formula I with, for example, a comonomer having an acid decomposable group. A photoacid generator is a chemical substance capable of generating an acid by irradiation with chemical rays described below. The chemical amplification type of positive photosensitive resin composition can be generally prepared by mixing the styrene polymer with a photoacid generator.

When a film is formed from the positive photosensitive resin composition, patterned by exposure with chemical rays described later, an acid is generated from the photoacid generator in an exposed area. The acid decomposes an acid decomposable group in the styrene polymer. Thus, after development, solubility in an alkaline developer is increased in the exposed area. Consequently, a solubility contrast between an exposed and an unexposed areas is increased. Patterning using a positive photosensitive resin composition is conducted utilizing such a solubility difference in an alkaline developer. Since an acid generated from the photoacid generator causes a solubility contrast as described above, the positive photosensitive resin composition is of a so-called chemical amplification type.

A photoacid generator is a chemical substance capable of generating an acid by irradiation with chemical rays described later and may be any of those whose mixture with a polymer in the present invention is adequately soluble in a solvent described later and the solution obtained can be used to form a uniform film by, for example, spin coating using a spin coater. The photoacid generators may be used alone or in combination with two or more.

Examples of a photoacid generator which can be used include triarylsulfonium salt derivatives, diaryliodonium salt derivatives, dialkylphenacylsulfonium salt derivatives, nitrobenzylsulfonate derivatives, sulfonates of N-hydroxynaphthalimide and sulfonate derivatives of N-hydroxysuccimide, but not limited to those as long as they meet the above conditions.

A content of the photoacid generator is preferably 0.2 wt % or more, more preferably 1 wt % or more to the total of the styrene polymer and the photoacid generator in the light of achieving adequate sensitivity of a photosensitive resin composition and satisfactory patterning. On the other hand, it is preferably 30 wt % or less, more preferably 15 wt % or less in the light of forming a uniform applied film and preventing a residue (scum) after development. If a content of the photoacid generator is less than 0.2 wt %, resolution of a pattern obtained may be reduced, while if it is more than 30 wt %, a uniform applied film may not be formed, leading to a residue (scum) after development.

<Chemical Amplification Type of Negative Photosensitive Resin Composition>

A chemical amplification type of negative photosensitive resin composition of the present invention contains a styrene polymer of the present invention and a photoacid generator as a photosensitizer. The styrene polymer of the present invention may be selected from styrene polymers having an acid crosslinkable group such as those having a constitutional unit in which A is hydrogen atom in general formula II and those prepared by copolymerizing a styrene derivative of the present invention represented by general formula I with, for example, a comonomer having an acid crosslinkable group. The chemical amplification type of negative photosensitive resin composition can be generally prepared by mixing the styrene polymer with a photoacid generator.

When a film is formed from the negative photosensitive resin composition and patterned by exposure with chemical rays described later, an acid is generated from the photoacid generator in an exposed area and the acid initiates a crosslinking reaction in the exposed area. Thus, after development, an exposed area becomes insoluble in an alkaline developer, resulting in a larger solubility contrast between an exposed area and an unexposed area. Patterning using the negative photosensitive resin composition is conducted utilizing such a solubility difference in an alkaline developer. Since an acid generated from the photoacid generator causes a solubility contrast as described above, the negative photosensitive resin composition is of a so-called chemical amplification type.

A photoacid generator is a chemical substance capable of generating an acid by irradiation with chemical rays described later and may be any of those whose mixture with a polymer in the present invention is adequately soluble in a solvent described later and the solution obtained can be used to form a uniform film by, for example, spin coating using a spin coater. The photoacid generators may be used alone or in combination with two or more.

Examples of a photoacid generator which can be used include triarylsulfonium salt derivatives, diaryliodonium salt derivatives, dialkylphenacylsulfonium salt derivatives, nitrobenzylsulfonate derivatives, sulfonates of N-hydroxynaphthalimide and sulfonate derivatives of N-hydroxysuccimide, but not limited to those as long as they meet the above conditions.

A content of the photoacid generator is preferably 0.2 wt % or more, more preferably 1 wt % or more to the total of the styrene polymer and the photoacid generator in the light of achieving adequate sensitivity of a photosensitive resin composition and satisfactory patterning. On the other hand, it is preferably 30 wt % or less, more preferably 15 wt % or less in the light of forming a uniform applied film and preventing a residue (scum) after development. If a content of the photoacid generator is less than 0.2 wt %, resolution of a pattern obtained may be reduced, while if it is more than 30 wt % a uniform applied film may not be formed, leading to a residue (scum) after development.

A negative photosensitive resin composition may contain, as an additive for promoting a crosslinking reaction, one or more of polyfunctional epoxy compounds, phenol derivatives, polynuclear phenol derivatives and polyols.

Examples of a polyfunctional epoxy compound include bisphenol-A diglycidyl ether, hydrogenated bisphenol-A diglycidyl ether, ethylene glycol diglycidyl ether, diethylene glycol diglycidyl ether, propylene glycol diglycidyl ether, tripropylene glycol diglycidyl ether, neopentyl glycol diglycidyl ether, 1,6-hexanediol diglycidyl ether, glycerin diglycidyl ether, trimethylolpropane triglycidyl ether, 1,2-cyclohexanecarboxylic acid diglycidyl ester, 3,4-epoxycyclohexylmethyl 3,4-epoxycyclohexane carboxylate, tris(epoxypropyl) isocyanurate, 2-epoxyethylbicyclo[2,2,1]heptylglycidyl ether, ethylene glycol bis(2-epoxyethylbicyclo[2,2,1]heptyl) ether and bis(2-epoxyethylbicyclo[2,2,1]heptyl) ether.

Examples of a phenol derivative and a polynuclear phenol derivative include catechol, hydroquinone, pyrogallol, 1,2,4-benzentriol, 2,6-bis(hydroxymethyl)-p-cresol, bisphenol-A, 4,4',4''-trihydroxytriphenylmethane, 1,1,1-tris(4-hydroxyphenyl)ethane and α,α,α'-tris(4-hydroxyphenyl)-1-ethyl-4-isopropylbenzene.

Examples of a polyol include ethylene glycol, glycerin, 1,2-butanediol, 1,3-butanediol, 1,4-butanediol, 2,3-butanediol, 1,2,4-butanetriol, 1,2-pentanediol, 1,4-pentanediol, 1,5-pentanediol, 2,4-pentanediol, 1,2-hexanediol, 1,5-hexanediol, 1,6-hexanediol, 2,5-hexanediol, 1,2-cyclohexanediol, 1,3-cyclohexanediol, 1,4-cyclohexanediol, 1,2-cyclohexanedimethanol, 1,4-cyclohexanedimethanol, 1,3,5-cyclohexanetrimethanol, 1,2-cyclopentanediol, 1,3-cyclopentanediol, 1,2-cyclooctanediol, 1,5-cyclooctanediol, tricyclodecanedimethanol, 2,3-norbornanediol, 2(3)-hydroxy-5,6-bis(hydroxymethyl)norbornane, 2,3-dihydroxy-5 (6)-hydroxymethylnorbornane and 1,4-anhydroerythritol.

A content of the additive, if added, is generally 0.5 to 40 parts by weight, preferably 1 to 30 parts by weight to 100 parts by weight of all components including the additive itself. They may be used alone or in combination of two or more.

An appropriate solvent may be, if necessary, used in preparation of a photosensitive resin composition of the present invention as described above. As the solvent, any organic solvent may be used without limitations as long as it can adequately dissolve a photosensitive resin composition, a resultant solution can be used to form a uniform film by, for example, spin coating, and it can be evaporated during a pre-bake step described later. Specific examples include y-butyrolactone, propylene glycol monomethyl ether acetate, propylene glycol monoethyl ether acetate, ethyl lactate, 2-heptanone, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidone, cyclohexanone, cyclopentanone, methyl isobutyl ketone, ethylene glycol monomethyl ether, ethylene glycol monomethyl ether acetate, ethylene glycol monoethyl ether, ethylene glycol monoisopropyl ether, diethylene glycol monomethyl ether and diethylene glycol dimethyl ether, which may be used alone or in combination of two or more.

Furthermore, a photosensitive resin composition may contain, if necessary, other components such as a dissolution promoter, a dissolution inhibitor, a surfactant, a pigment, a stabilizer, a coating improver and a dye.

As described above, any of the photosensitive resin compositions of the present invention gives excellent pattern resolution, can be developed with an alkaline developer, and gives excellent film properties such as heat resistance, mechanical properties and electric properties. Thus, such a photosensitive resin composition is suitable as an interlayer insulating film or surface protection film.

<Patterning Method>

A patterning method of the present invention has at least an application step, an exposure step, a development step, a post-bake step. In particular, the patterning method of the present invention comprises at least: an application step applying the photosensitive resin composition of the present invention on a processed substrate; a pre-bake step fixing the photosensitive resin composition on the processed substrate; an exposure step selectively exposing the photosensitive resin composition; a development step dissolving and removing the exposed or the unexposed area in the photosensitive resin composition to form a pattern; and a post-bake step curing the patterned photosensitive resin composition.

In the application step, the above photosensitive resin composition is applied on a processed substrate such as a silicon wafer and a ceramic substrate to form its film. Application may be conducted by spin coating using a spin coater, spray coating using a spray coater, immersion, printing and roll coating.

In the pre-bake step, the photosensitive resin composition applied on the processed substrate is dried and remove a solvent in the photosensitive resin composition to fix the photosensitive resin composition applied on the processed substrate. The pre-bake step is conducted generally at 60 to 150° C.

In the exposure step, the photosensitive resin composition is selectively exposed by chemical rays via a photomask to form an exposed and an unexposed areas, to transfer a pattern in a photomask to the photosensitive resin composition. Chemical rays used in the pattern exposure which may be used include ultraviolet ray, visible light ray, Excimer laser, electron beam ray and X-ray, and preferably chemical rays having a wavelength of 180 to 500 nm.

In the development step, an exposed or unexposed area in the photosensitive resin composition is dissolved and removed in an alkaline developer to form a pattern. The above exposure step generates a solubility contrast in an alkaline developer between an exposed and an unexposed areas in the photosensitive resin composition. Utilizing the solubility contrast, an exposed or unexposed area in the photosensitive resin composition is removed by dissolution to give a pattern. Examples of an alkaline developer which can be used include an aqueous alkaline solution of a quaternary ammonium salt such as tetramethylammonium hydroxide (TMAH) and tetraethylammonium hydroxide or an aqueous solution prepared by adding an appropriate amount of an additive such as a water-soluble alcohol including methanol and ethanol and surfactants to the above solution. Development may be conducted by, for example, paddling, immersing and spraying. After development, the pattern formed is rinsed with water.

In the post-bake step, the pattern formed is heated in the air or under an atmosphere of an inert gas such as nitrogen, to improve adhesiveness of the pattern to the processed substrate. In the post-bake process, heating the pattern formed in the photosensitive resin composition causes structural change (modification) in a styrene polymer constituting the photosensitive resin composition to form a benzoxazole ring, resulting in curing of the pattern. Thus, a pattern having excellent film properties such as heat resistance, mechanical properties and electric properties can be obtained. The post-bake step is generally conducted at 100 to 380° C. The post-bake step may be conducted in one step or in multiple steps.

In particular, when using a chemical amplification type of positive or negative photosensitive resin composition of the present invention, a bake-after-exposure step may be inserted between the exposure step and the development step. An acid generated from the photoacid generator initiates an acid-catalyzed reaction with, for example, a resist resin during the post-exposure-bake step. Thus, a positive or negative composition promotes decomposition of an acid decomposable group or a crosslinking reaction, respectively. Consequently, a solubility contrast can be further increased to form a good pattern with a smaller light exposure. The post-exposure-bake step is generally conducted at 70 to 160° C.

In particular, when using a chemical amplification type of positive photosensitive resin composition of the present invention, a post-exposure step may be inserted between the development step and the post-bake step. The post-exposure step causes generation of an acid from a photoacid generator in the patterned photosensitive resin and in the subsequent post-bake step, the acid decomposes an acid decomposable group in the styrene polymer to promote formation of a benzoxazole ring.

EXAMPLES

There will be more specifically described the present invention with reference to Examples.

Example 1

A styrene derivative having the following structure was synthesized, that is, a styrene derivative represented by general formula I in which $R^1$ to $R^9$ are hydrogen atom, X is —CONH—, and A is hydrogen atom.

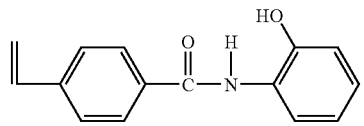

In a mixture solvent of 500 mL of ethyl acetate and 150 mL of tetrahydrofuran were dissolved 50 g of 4-vinylbenzoic acid and 62.1 g of pentafluorophenol, and the solution was ice-cooled. To the solution was added 69.65 g of dicyclohexyl-carbodiimide, and the mixture was stirred under ice-cooling for 1 hour and then at room temperature for 1 hour. Precipitated dicyclohexylurea was filtered off and the filtrate was concentrated under a reduced pressure. To the residue was added 150 mL of hexane, and precipitated dicyclohexylurea was filtered off. Then, the filtrate was concentrated under a reduced pressure to give 99 g of pentafluorophenyl 4-vinylbenzoate.

Then, in 50 mL of N,N-dimethylformamide were dissolved 10 g of pentafluorophenyl 4-vinylbenzoate and 4.17 g of o-aminophenol, and the solution was stirred at 80° C. for 9 hours. After allowing it to be cooled, it was poured into water and the organic layer was extracted with ethyl acetate. The organic layer was sequentially washed with 0.4 N hydrochloric acid and brine, dried over magnesium sulfate and evaporated under a reduced pressure. The residue was washed with 150 mL of hexane, and then recrystallized from ethyl acetate/hexane (2/1) to give 2.44 g of the desired product (yield: 32%).

The $^1$H-NMR (THF-$d_8$) results for the compound obtained were as follows: δ 5.34 (1H, d), 5.92 (1H, d), 6.77-7.00 (4H, m), 7.56 (2H, d), 7.83 (1H, d), 7.94 (2H, d), 9.11 (1H, s), 9.25 (1H, s).

Example 2

A styrene derivative having the following structure was synthesized, that is, a styrene derivative represented by general formula I in which $R^1$ to $R^9$ are hydrogen atom, X is —CH=N—, and A is hydrogen atom.

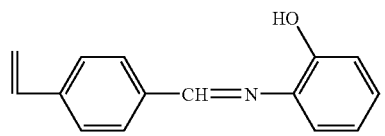

In 100 mL of toluene were dissolved 5 g of 4-vinylbenzaldehyde and 4.54 g of o-aminophenol, and the solution was stirred at 80 to 85° C. for 4 hours. After allowing it to be cooled, it was concentrated under a reduced pressure to about a half, and precipitated o-aminophenol was filtered off. The residue was recrystallized from hexane/toluene (4/1) to give 5.42 g of the desired compound (yield: 64%).

The $^1$H-NMR (THF-$d_8$) results for the compound obtained were as follows: δ 5.38 (1H, d), 5.87 (1H, d), 6.77 (1H, dd), 6.91 (1H, t), 7.02 (1H, d), 7.18-7.32 (3H, m), 7.52 (2H, d), 7.88 (1H, d), 8.68 (1H, s).

Example 3

A styrene derivative having the following structure was synthesized, that is, a styrene derivative represented by general formula I in which $R^1$ to $R^9$ are hydrogen atom, X is —CONH—, and A is ethoxymethyl group.

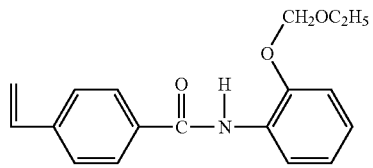

In 90 mL of N-methyl-2-pyrrolidone were dissolved 10 g of the styrene derivative obtained in Example 1 and 8.1 g of N-ethyldiisopropylamine. To the solution was added 4.346 g of chloromethyl ethyl ether and the mixture was reacted at room temperature for 20 hours. To the reaction solution was added 200 mL of diethyl ether, and the mixture was sequentially washed with 0.2 N hydrochloric acid, 3% aqueous sodium hydrogen carbonate solution and brine. The organic layer was dried over magnesium sulfate and evaporated under a reduced pressure. The residue was recrystallized from hexane to give 8.76 g of the desired styrene derivative (yield: 70%).

The $^1$H-NMR (THF-$d_8$) results for the compound obtained were as follows: δ 1.19 (3H, t), 3.74 (2H, q), 5.33 (2H, s), 5.34 (1H, d), 5.9 (1H, d), 6.8 (1H, dd), 6.96-7.02 (2H, m), 7.19-7.21 (1H, m), 7.55 (2H, d), 7.9 (2H, d), 8.45-8.48 (1H, m), 8.79 (1H, s).

Example 4

A styrene polymer having the following structure was synthesized, that is, a styrene polymer represented by general formula II in which $R^1$ to $R^9$ are hydrogen atom, X is —CONH—, and A is hydrogen atom.

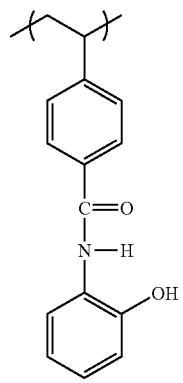

In 10 mL of tetrahydrofuran was dissolved 2 g of the styrene derivative obtained in Example 1. To the solution was added 0.041 g of 2,2'-azobis(isobutyronitrile) and the mixture was heated at reflux under an argon atmosphere for 10 hours. After allowing it to be cooled, it was re-precipitated in 200 mL of diethyl ether. The precipitated polymer was filtered and again purified by re-precipitation, to give 1.5 g of the desired polymer (yield: 75%).

GPC analysis indicated that it had a weight average molecular weight (Mw) of 14500 (converted to polystyrene) and a dispersion (Mw/Mn) of 1.78.

Example 5

A styrene polymer having the following structure was synthesized, that is, a styrene polymer represented by general formula II in which $R^1$ to $R^9$ are hydrogen atom, X is —CH=N—, and A is hydrogen atom.

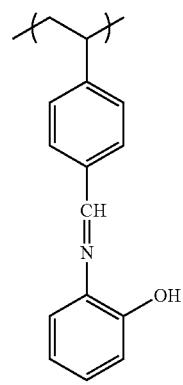

In 170 mL of toluene were dissolved 17.38 g of 4-vinylbenzaldehyde and 10.89 g of ethylene glycol. To the solution were added 0.25 g of p-toluenesulfonic acid monohydrate and 0.22 g of p-hydroquinene, and the mixture was heated at reflux. Water generated during the reaction was removed by a Dean-Stark trap. After 8 hours, it was allowed to be cooled and evaporated under a reduced pressure. The residue was distilled under vacuum (92 to 93° C./0.45 mmHg), to give 13.44 g of 4-(2,5-dioxocyclopentyl)styrene (yield: 58%).

Then, in 53 mL of toluene was dissolved 13.4 g of 4-(2,5-dioxocyclopentyl)styrene. To the solution was added 0.375 g of 2,2-azobis(isobutyronitrile), and the mixture was stirred under an argon atmosphere at 80° C. for 12 hours. After allowing it to be cooled, it was poured into 600 mL of methanol. The precipitated polymer was collected by filtration and purified by re-precipitation to give 10.75 g of poly[4-(2,5-dioxocyclopentyl)styrene] (yield: 80%).

Next, in 200 mL of tetrahydrofuran was dissolved 4 g of poly[4-(2,5-dioxocyclopentyl)styrene]. To the solution was added 12 mL of 2 N hydrochloric acid, and the mixture was stirred at room temperature for 3 hours. It was concentrated under a reduced pressure to an about ½. To the concentrate was added 200 mL of dichloromethane. The mixture was washed with a 5% aqueous sodium carbonate solution and brine. The organic layer was dried over magnesium sulfate and then concentrated under a reduced pressure to an about ½. To the residue were added 9.91 g of o-aminophenol and 0.088 g of p-toluenesulfonic acid monohydrate, and the mixture was stirred at room temperature for 12 hours. The mixture was concentrated under a reduced pressure and re-precipitated in 400 mL of methanol and the precipitated polymer was collected by filtration. After further purification by re-precipitation, 1.3 g of the desired polymer was obtained (yield: 26%).

The polymer obtained had a weight average molecular weight (Mw) of 16,400 (converted to polystyrene) and a dispersion (Mw/Mn) of 1.83.

Example 6

A polymer having the following structure was synthesized, that is, a polymer as shown below which consists of 85 mol % of a constitutional unit represented by general formula II in which $R^1$ to $R^9$ are hydrogen atom, X is —CONH—, and A is hydrogen atom; and 15 mol % of an acrylonitrile constitutional unit.

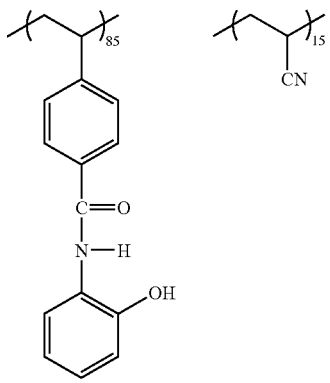

In 15 mL of tetrahydrofuran were dissolved 3 g of the styrene derivative obtained in Example 1 and 0.118 g of acrylonitrile. To the solution was added 0.073 g of 2,2-azobis (isobutyronitrile), and the mixture was heated at reflux under an argon atmosphere for 10 hours. The reaction mixture was allowed to be cooled, re-precipitated in 200 mL of methanol. The precipitated polymer was collected by filtration. After further purification by re-precipitation, 2.43 g of the desired polymer was obtained (yield: 78%).

The polymer obtained had an Mw of 15200 and an Mw/Mn of 1.80.

Example 7

A polymer having the following structure was synthesized, that is, a polymer as shown below which consists of 85 mol % of a constitutional unit represented by general formula II in which $R^1$ to $R^9$ are hydrogen atom, X is —CONH—, and A is hydrogen atom; and 15 mol % of a styrene constitutional unit.

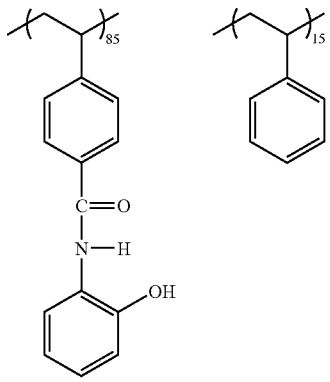

A reaction was conducted as described in Example 6 substituting 0.23 g of styrene for 0118 g of acrylonitrile, to give 2.65 g of the styrene polymer (yield: 82%).

The polymer obtained had an Mw of 18400 and an Mw/Mn of 1.77.

Example 8

A polymer having the following structure was synthesized, that is, a polymer as shown below which consists of 60 mol % of a constitutional unit represented by general formula II in which $R^1$ to $R^9$ are hydrogen atom, X is —CONH—, and A is hydrogen atom; and 40 mol % of a constitutional unit represented by general formula II in which $R^1$ to $R^9$ are hydrogen atom, X is —CONH—, and A is ethoxymethyl group.

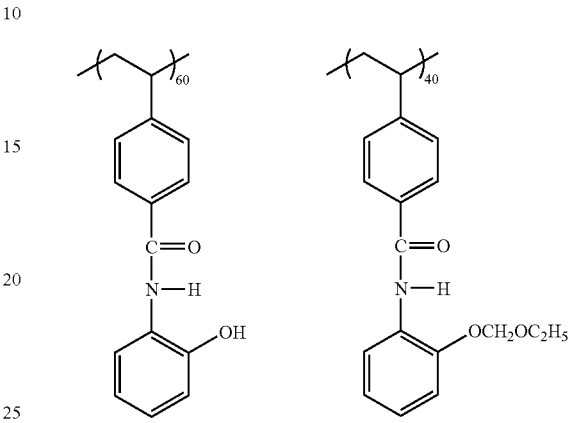

In 28 mL of tetrahydrofuran were dissolved 5 g of the styrene derivative obtained in Example 1 and 4.14 g of the styrene derivative obtained in Example 3. To the solution was added 0.172 g of 2,2'-azobis(isobutyronitrile), and the mixture was heated at reflux under an argon atmosphere for 3 hours. After allowing the reaction mixture to be cooled, it was re-precipitated in 300 mL of diethyl ether. The precipitated polymer was collected by filtration and again purified by re-precipitation, to give 7.29 g of the desired polymer (yield: 78%). GPC analysis indicated that it had a weight average molecular weight (Mw) of 46000 (converted to polystyrene) and a dispersion (Mw/Mn) of 1.98.

Example 9

A polymer having the following structure was synthesized, that is, a polymer as shown below which consists of 60 mol % of a constitutional unit represented by general formula II in which $R^1$ to $R^9$ are hydrogen atom, X is —CONH—, and A is hydrogen atom; and 40 mol % of a constitutional unit represented by general formula III in which $R^{10}$ is t-butoxycarbonyl group.

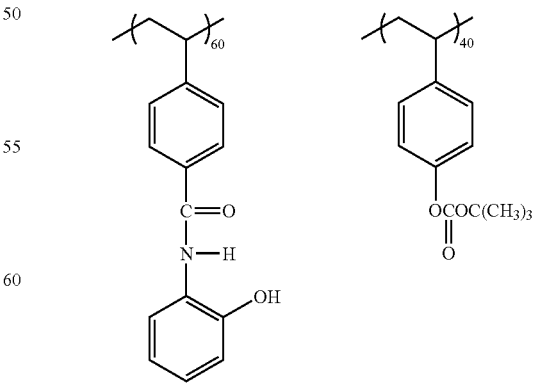

A reaction was conducted as described in Example 8, substituting 3.07 g of 4-(t-butoxycarbonyloxy)styrene for 4.14 g of the styrene derivative obtained in Example 3, to give 6.46 g of the styrene polymer (yield: 80%). The polymer obtained had an Mw of 45000 and an Mw/Mn of 2.05.

Example 10

A polymer having the following structure was synthesized, that is, a polymer as shown below which consists of 90 mol % of a constitutional unit represented by general formula II in which $R^1$ to $R^9$ are hydrogen atom, X is —CONH—, and A is hydrogen atom; and 10 mol % of a constitutional unit represented by general formula V in which $R^{13}$ is methyl group and $R^{14}$ is 3,4-epoxy-1-cyclohexylmethyl group.

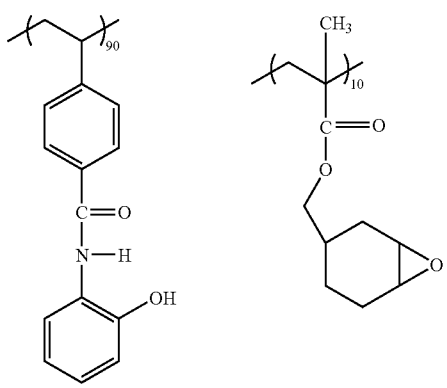

In 65 mL of tetrahydrofuran were dissolved 20 g of the styrene derivative obtained in Example 1 and 1.823 g of 3,4-epoxy-1-cyclohexylmethyl methacrylate. To the solution was added 0.61 g of 2,2'-azobis(isobutyronitrile), and the mixture was heated at reflux under an argon atmosphere for 2.5 hours. After allowing the reaction mixture to be cooled, it was re-precipitated in 600 mL of diethyl ether. The precipitated polymer was collected by filtration and again purified by re-precipitation, to give 14.7 g of the desired polymer (yield: 67%). GPC analysis indicated that it had a weight average molecular weight (Mw) of 73000 (converted to polystyrene) and a dispersion (Mw/Mn) of 2.53.

Example 11

A non-chemical amplification type of photosensitive resin composition was prepared, which had the following composition:
(a) 2 g of the polymer obtained in Example 4, (b) 0.5 g of a photosensitizing agent (1,2-diazonaphthoquinonesulfonate derivative; Toyo Gosei Co. Ltd., trade name: 4NT-300) and (c) 4.6 g of N-methyl-2-pyrrolidone.

The above (a) to (c) were mixed and the mixture was filtrated through a 0.2 μm Teflon (Registered Trade Mark) filter to prepare a photosensitive resin composition.

On a 4 inch silicon substrate was spin-coated the above photosensitive resin composition, which was then baked on a hot plate at 110° C. for 2 min, to form a film with a thickness of 8 μm. Then, the film of the photosensitive resin composition was patterned by exposure with ultraviolet rays (wavelength λ=350 to 450 nm) via a photomask for evaluating a positive resist resolution. After the exposure, it was developed by immersing it in a 2.38% aqueous solution of tetramethylammonium hydroxide (TMAH) at room temperature for 2 min, and then rinsed with pure water for 30 sec. Resultantly, a so-called positive pattern was formed, in which the photosensitive resin composition in an exposed area had been removed by dissolution in a developing solution. SEM observation of the pattern formed indicated that resolution to a 9 μm throughhole pattern was obtained in exposure at 270 mJ/cm$^2$.

Subsequently, the pattern formed was baked under a nitrogen atmosphere in an oven at 150° C. for 30 min and then at 260° C. for 1 hour, for forming a benzoxazole ring to obtain the final pattern with a thickness of 6.5 μm after curing, exhibiting excellent properties such as heat resistance. SEM observation of the pattern formed indicated no cracks or delaminations in the pattern.

Evaluation was conducted as described above for a photosensitive resin composition prepared, substituting the polymer obtained in Example 7 for the polymer obtained in Example 4. Table 1 shows the evaluation results for their sensitivity and resolution in a through-hole pattern.

TABLE 1

|  | Resolution (μm) | Sensitivity (mJ/cm$^2$) |
| --- | --- | --- |
| Photosensitive resin composition containing the polymer in Ex. 4 | 9 | 270 |
| Photosensitive resin composition containing the polymer in Ex. 7 | 9 | 280 |

Example 12

A chemical amplification type of positive photosensitive resin composition was prepared, which had the following composition:
(a) 2 g of the polymer obtained in Example 8, (b) 0.1 g of a photoacid generator (N-(trifluoromethylsulfonyloxy) naphthalimide, Midori Kagaku Co. Ltd., trade name: NAI-105) and (c) 4.25 g of γ-butyrolactone.

The above (a) to (c) were mixed and the mixture was filtrated through a 0.2 μm Teflon (Registered Trade Mark) filter to prepare a photosensitive resin composition.

On a 5 inch silicon substrate was spin-coated the above photosensitive resin composition, which was then baked in an oven at 90° C. for 20 min, to form a film with a thickness of 9 μm. Then, the film of the photosensitive resin composition was patterned by exposure with ultraviolet rays (wavelength λ=350 to 450 nm) via a photomask for evaluating a positive resist resolution. After the exposure, it was baked in an oven at 100° C. for 10 min and then developed by immersing it in a 2.38% aqueous solution of tetramethylammonium hydroxide (TMAH) at room temperature for 3 min, and then rinsed with pure water for 30 sec. Resultantly, a so-called positive pattern was formed, in which the photosensitive resin composition in an exposed area had been removed by dissolution in a developing solution. SEM observation of the pattern formed indicated that resolution to a 8 μm throughhole pattern was obtained in exposure at 200 mJ/cm$^2$. Then, the whole surface of the patterned wafer was exposed to ultraviolet rays (wavelength λ=350 to 450 nm) at a dose of 300 mJ/cm$^2$ and then baked under a nitrogen atmosphere in an oven at 110° C. for 30 min and then at 260° C. for 1 hour, for forming a benzoxazole ring to obtain the final pattern with a thickness of 7.2 μm after curing, exhibiting excellent properties such as heat resistance. SEM observation of the pattern formed indicated no cracks or delaminations in the pattern.

Evaluation was conducted as described above for a photosensitive resin composition prepared, substituting the polymer obtained in Example 9 for the polymer obtained in Example 8. Resultantly, resolution to a 8 μm through-hole pattern was obtained in exposure at 250 mJ/cm².

Examples 13 to 15

Chemical amplification type negative photosensitive resin compositions of Examples 13 to 15 were prepared, which had compositions shown in Table 2.

TABLE 2

|  | Polymer | Photoacid generator | Additive (NOTE) | Solvent |
|---|---|---|---|---|
| Ex. 13 | Polymer of Ex. 10: 2 g | NAI-105: 0.1 g | None | γ-Butyrolactone: 4.67 g |
| Ex. 14 | Polymer of Ex. 10: 2 g | NAI-105: 0.1 g | Epoxy compound: 0.2 g | γ-Butyrolactone: 5.13 g |
| Ex. 15 | Polymer of Ex. 10: 2 g | NAI-105: 0.1 g | Polynuclear phenol: 0.2 g | γ-Butyrolactone: 5.13 g |

(NOTE)
Epoxy compound: 3,4-epoxycyclohexylmethyl-3-4-epoxycyclohexanecarboxylate;
Polynuclear phenol: 4,4',4''-trihydroxytriphenylmethane.

A mixture of a polymer, a photoacid generator, an additive and solvent shown in the above was filtrated through a 0.2 μm Teflon (Registered Trade Mark) filter to prepare the photosensitive resin compositions of Examples 13 to 15.

On a 5 inch silicon substrate was spin-coated each of the above photosensitive resin compositions, which was then baked in an oven at 80° C. for 20 min, to form a film with a thickness of 5 μm. Then, the film of the photosensitive resin composition was exposed to ultraviolet rays (wavelength λ=350 to 450 nm) via a photomask for evaluating a negative resist resolution. After the exposure, the wafer was baked in an oven at 100° C. for 10 min and then developed by immersing it in a 2.38% aqueous tetramethylammonium hydroxide (TMAH) solution at room temperature for 6 min. Subsequently, it was rinsed with pure water for 30 sec. Resultantly, a so-called negative pattern was obtained, in which the photosensitive resin composition in the unexposed area had been removed by dissolution in the developing solution. Then, the pattern obtained was baked under a nitrogen atmosphere in an oven at 120° C. for 30 min and then at 260° C. for 1 hour for forming a benzoxazole ring to give the final pattern with a thickness of 4.5 μm after curing, exhibiting excellent properties such as heat resistance. SEM observation of the pattern formed indicated no cracks or delaminations in the pattern.

Table 3 shows the evaluation results of these photosensitive resin compositions for their sensitivity and resolution in a through-hole pattern.

TABLE 3

|  | Resolution (μm) | Sensitivity (mJ/cm²) |
|---|---|---|
| Ex. 13 | 9 | 350 |
| Ex. 14 | 9 | 300 |
| Ex. 15 | 9 | 280 |

In these examples, all of $R^1$ to $R^9$ in general formulas I and II are hydrogen atom. For example, a corresponding compound where $R^1$ is methyl group can be manufactured exactly as described in Example 1, substituting 4-carboxy-a-methylstyrene for 4-vinylbenzoic acid, and a corresponding compound where $R^2$ to $R^9$ are halogen atom can be manufactured exactly as described in Example 1, substituting respectively halogen-substituted compound for 4-vinylbenzoic acid and o-aminophenol.

A chemical amplification type of negative photosensitive resin composition containing a polyol as an additive can be also manufactured as described in Example 15, substituting the polyol for the polynuclear phenol.

INDUSTRIAL APPLICABILITY

As described above, a polymer of the present invention obtained by polymerizing a styrene derivative of the present invention can be used in a photosensitive resin composition, to give a positive or negative photosensitive resin composition which can be developed with an aqueous alkaline solution, exhibits excellent resolution and can be used for an interlayer insulating film or surface protection film in a semiconductor device.

The invention claimed is:

1. A photosensitive resin composition comprising the styrene polymer and a photosensitizer, wherein the styrene polymer comprises one or more repeating constitutional units represented by general formula II:

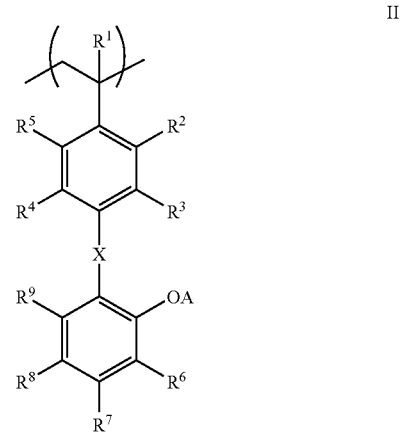

wherein $R^1$ represents hydrogen atom or methyl group; $R^2$ to $R^9$ independently represent hydrogen atom, halogen atom or alkyl group having 1 to 4 carbon atoms; X represents —CH=N—, —CONH—, —(CH$_2$)$_n$—CH=N— or —(CH$_2$)$_n$—CONH—, and the N atom in X is bonded to a carbon atom in the benzene ring having AO— at an o-position; A represents hydrogen atom or a group being decomposed by an acid; and n represents an integer of 1 to 3.

2. A positive photosensitive resin composition using the photosensitive resin composition as claimed in claim 1; wherein the styrene polymer has a constitutional unit represented by general formula II in which A is hydrogen atom; comprising a diazonaphthoquinonesulfonate derivative as the photosensitizer.

3. A positive photosensitive resin composition using the photosensitive resin composition as claimed in claim 1; wherein the styrene polymer has an acid decomposable group; comprising a photoacid generator as the photosensitizer.

4. A negative photosensitive resin composition using the photosensitive resin composition as claimed in claim 1; wherein the styrene polymer has an acid crosslinkable group; comprising a photoacid generator as the photosensitizer.

5. The negative photosensitive resin composition as claimed in claim 4, comprising a polyfunctional epoxy compound.

6. The negative photosensitive resin composition as claimed in claim 4, comprising a phenol derivative or a polynuclear phenol derivative.

7. The negative photosensitive resin composition as claimed in claim 4, comprising a polyol.

8. A patterning method comprising at least: an application step applying the photosensitive resin composition of claim 1 on a processed substrate; a pre-bake step fixing the photosensitive resin composition on the processed substrate; an exposure step selectively exposing the photosensitive resin composition; a development step dissolving and removing the exposed or the unexposed area in the photosensitive resin composition to form a pattern; and a post-bake step curing the patterned photosensitive resin composition.

9. A patterning method comprising at least: an application step applying the positive photosensitive resin composition of claim 1 on a processed substrate; a pre-bake step fixing the photosensitive resin composition on the processed substrate; an exposure step selectively exposing the photosensitive resin composition; a development step dissolving and removing the exposed or the unexposed area in the photosensitive resin composition to form a pattern; and a post-bake step curing the patterned photosensitive resin composition.

10. A patterning method comprising at least: an application step applying the positive photosensitive resin composition of claim 3 on a processed substrate; a pre-bake step fixing the photosensitive resin composition on the processed substrate; an exposure step selectively exposing the photosensitive resin composition; a development step dissolving and removing the exposed or the unexposed area in the photosensitive resin composition to form a pattern; and a post-bake step curing the patterned photosensitive resin composition.

11. The patterning method as claimed in claim 10; further comprising a post-exposure-bake step diffusing a generated acid by the exposure between the exposure step and the development step; wherein the exposed area is dissolved and removed in the development step.

12. The patterning method as claimed in claim 11; further comprising a post-exposure step between the development step and the post-bake step.

13. A patterning method comprising at least: an application step applying the negative photosensitive resin composition of claim 4 on a processed substrate; a pre-bake step fixing the photosensitive resin composition on the processed substrate; an exposure step selectively exposing the photosensitive resin composition; a development step dissolving and removing the exposed or the unexposed area in the photosensitive resin composition to form a pattern; and a post-bake step curing the patterned photosensitive resin composition.

14. The patterning method as claimed in claim 13; further comprising a post-exposure-bake step diffusing a generated acid by the exposure between the exposure step and the development step; wherein the unexposed area is dissolved and removed in the development step.

* * * * *